United States Patent [19]
Porter et al.

[11] Patent Number: 5,626,680
[45] Date of Patent: May 6, 1997

[54] THERMAL PROCESSING APPARATUS AND PROCESS

[75] Inventors: Cole D. Porter; Jessie R. Sanchez; Jeffrey M. Kowalski, all of San Jose, Calif.

[73] Assignee: Silicon Valley Group, Inc., San Jose, Calif.

[21] Appl. No.: 399,108

[22] Filed: Mar. 3, 1995

[51] Int. Cl.$^6$ .................................................. C23C 16/00
[52] U.S. Cl. ........................... 118/725; 118/715; 118/728; 118/729
[58] Field of Search .................................... 118/715, 725, 118/728, 729

[56] References Cited

U.S. PATENT DOCUMENTS 5,320,680  6/1994  Learn et al. .

FOREIGN PATENT DOCUMENTS 5-6894  1/1993  Japan .

*Primary Examiner*—Richard Bueker
*Attorney, Agent, or Firm*—William B. Walker

[57] ABSTRACT

Process for treating multiple parallel wafers positioned in a heating zone surrounded by a heater emitting radiant heat. A space of from 0.5 to 2.55 cm is maintained between each wafer, and the outer portions of each wafer are shielded from radiant heat emitted by the heater by means of a circular heat shield positioned between the outer edge of the wafer and the heater. The circular heat shield has an upper edge and a bottom edge, and is positioned at a distance of less than 0.5 cm from the outer edge of the wafer. The wafer is positioned to be substantially centered between said upper edge and said bottom edge of its respective heat shield, and the circular heat shield has a height of from 0.35 to 0.95. The heat provided by the heater can be sufficient to raise the temperature of the wafers from 21° C. up to 1100° C. at a rate of 100° C./min without causing thermal stress damage to the wafers. The thermal treatment apparatus comprises a combination of heating chamber surrounded by a heater and a thermal treatment boat as described above. Each wafer is positioned within a circular shield wall, and a distance of from 0.5 to 2.55 cm is maintained between adjacent wafers. The inner diameter of the circular shield wall is from 20.3 to 21.0 cm and the height thereof is from 0.35 to 0.95 cm. The inner diameter of the circular shield wall can be 3 mm greater than the outer diameter of said wafer.

15 Claims, 8 Drawing Sheets

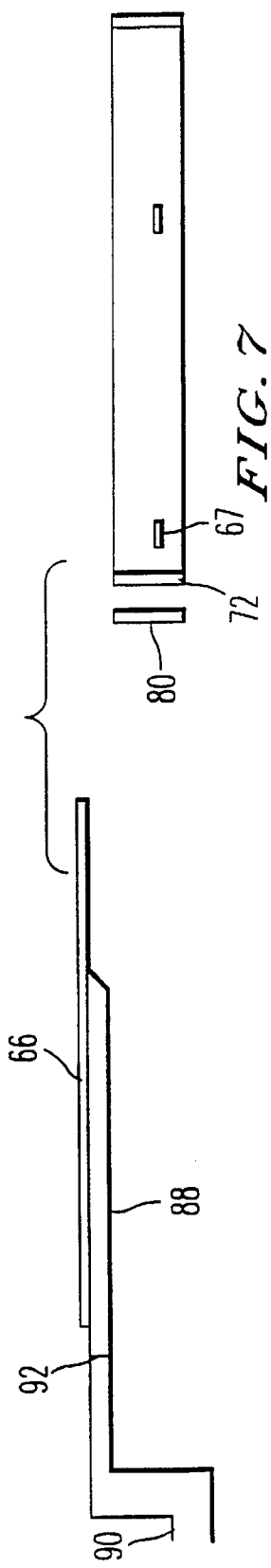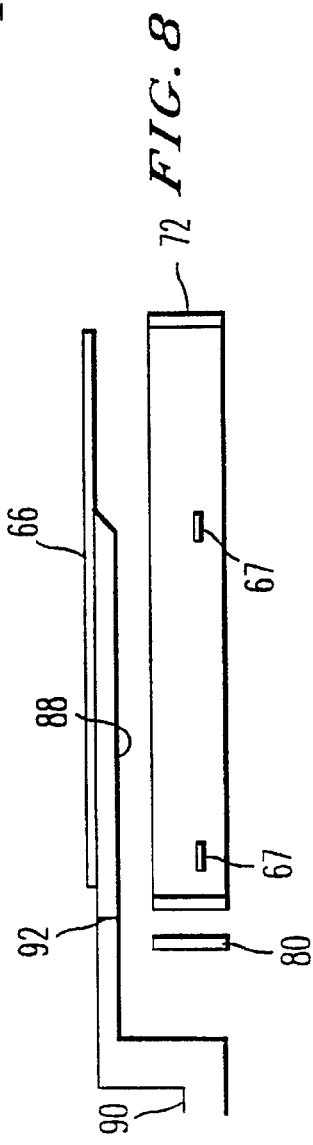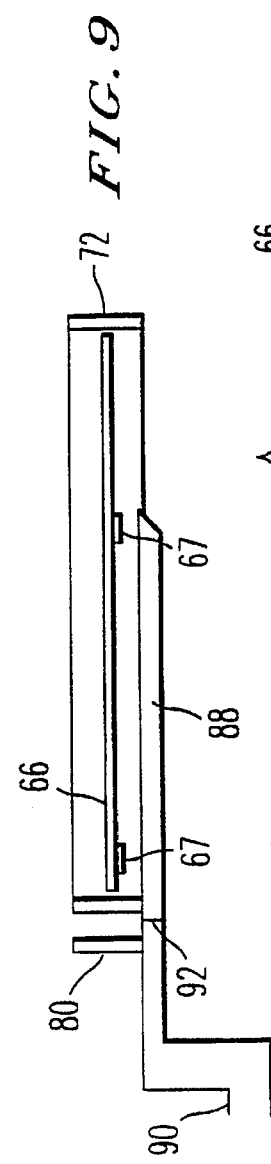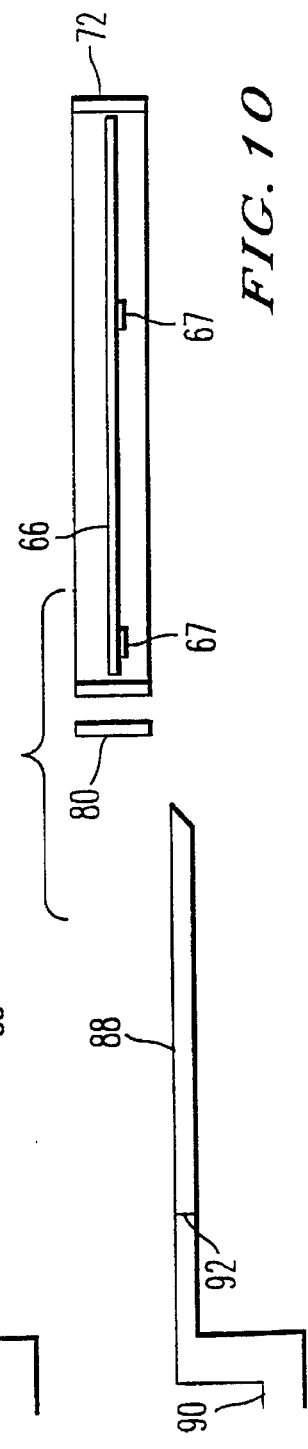

THERMAL PROCESSING APPARATUS AND PROCESS

FIELD OF THE INVENTION

This invention relates to a thermal processing apparatus and process for heat treatment of semiconductor and glass wafer substrate and the like.

BACKGROUND OF THE INVENTION

Heat treatment devices have been used to form diffusion layers or form silicon oxide or nitride films in the manufacture of electronic devices on semiconductor or glass substrates. These substrates are typically thin wafers made of silicon or other semiconductor, and the description of the device hereinafter will be provided in reference to wafer substrates, it being understood that the apparatus is equally suitable for treating any thin glass or semiconductor sheets, and treatment of all of these materials are considered to be within the scope of this invention.

These devices provide the desired heat treatment by heating the wafers in a reactor or heating chamber while introducing inert or reactive gases into the chamber. These heating chambers are surrounded by heating elements enclosed within an insulated shell. In order to treat large numbers of wafers in a single heat treatment operation, it is conventional to support the wafers, one above the other in a parallel orientation, in a wafer boat. This combination is referred to hereinafter as a wafer stack.

The heat treatment apparatus and process must accomplish the heat treatment without damaging the wafers such as by slips or warping, for example. Therefore, severe temperature differences across the width of the substrates must be avoided. On the other hand, the heating process should be as brief as necessary to accomplish the desired treatment.

The transfer temperature of the wafers to and from the furnace or reactor is from 500° to 600° C. The heating cycle is initiated after the wafer stack, at the transfer temperature, is positioned in the heating chamber, and ambient gases have been replaced by suitable protective gases. The usual wafer spacing in the wafer stack is approximately 4 mm per wafer. Heat radiating from the heating elements surrounding the heating chamber impinge primarily on the outer edges of the wafers. Increasing the heating and cooling rates causes an increase in temperature differences between the outer edge and center of the wafers, and an excessive increase in heating and cooling rates causes thermal distortions, leading to warping, crystal defects and slips in the wafers. The maximum heating rate in such configurations is limited to 10°–12° C./min, and the maximum cooling rate is about 5° C./min. This extends the time of each thermal treatment cycle and severely limits the production capacity or throughput of each thermal treatment device.

Japanese patent application publication Hei 4-184923 to Nishimura et al (Jul. 1, 1992) describes a heat treatment apparatus designed to reduce the heating time. In this apparatus, the wafers are supported in a circular jig having a heat capacity graduated to be maximum at the periphery of the wafers. The jigs comprise ring-shaped trays which hold the wafers around their peripheries, the thickness of the heat capacity of the tray being constant or increasing from the inside to the outside. The trays can be formed from several materials in which the specific heat is greater on the outside than the inside. The Nishimura et al system greatly increases the heat capacity of the components in the heating chamber, requiring the provision of greater heat energy for the heating phase and greater heat removal during the cooling phase of the cycle, and the minimum times of both the heating and cooling phases are extended by these high heat capacity components.

OBJECTS AND SUMMARY OF THE INVENTION

It is an object of this invention to provide a rapid heating and cooling thermal treatment apparatus and process with heating rates of from 50° to 100° C./min and cooling rates up to 50° C./min.

It is another object of this invention to provide a thermal treatment apparatus and method which greatly reduces the temperature differences across the width and surfaces of a stack of wafers being processed, thereby greatly reducing or eliminating thermal stress damage to the wafers being treated.

In summary, the process of this invention heat treats multiple wafers positioned in a mutually parallel orientation in a heating zone surrounded by a heater emitting radiant heat. In this process, a space of from 0.5 to 2.55 cm is maintained between each wafer, and the outer portions of each wafer are shielded from radiant heat emitted by the heater by means of a circular heat shield positioned between the outer edge of the wafer and the heater. Preferably, the circular heat shield has an upper edge and a bottom edge, and is positioned at a distance of less than 0.5 cm from the outer edge of the wafer. The wafer is positioned to be substantially centered between said upper edge and said bottom edge of its respective heat shield, and the circular heat shield has a height of from 0.35 to 0.95 cm. The heat provided by the heater can be sufficient to raise the temperature of the wafers from 21° C. up to 1100° C. at a rate of from 50° to 100° C./min without causing thermal stress damage to the wafers.

In summary, the thermal boat wafer treatment section of this invention comprises a circular shield wall having an upper edge, a lower edge, the shield being an incomplete circle with opposed first and second end surfaces defining a wafer transport slot therebetween. The inner shield wall surface thereof has a plurality of wafer support projections extending inwardly therefrom, each wafer support projection having a wafer support surface positioned for supporting a wafer thereon in a position which is substantially centered between said upper edge and said lower edge of the circular shield wall. The treatment section includes a wafer transport slot shield element, laterally displaced from said shield wall and positioned to block direct radiant heat passage through the wafer transport slot.

Preferably, the wafer transport slot shield element is integral with said first end and extends therefrom to a position overlapping said second end surface; and the inner diameter of the circular shield wall is from 20.3 to 21.0 cm and the height thereof is from 0.35 to 0.95 cm. The inner diameter of the circular shield wall for a wafer of a specific diameter can be 3 mm greater than the outer diameter of said wafer. For treating wafers having a diameter of approximately 20 cm, the inner diameter of the shield wall is preferably 3 mm greater than the outer diameter of said wafers and the height thereof is from 0.35 to 0.95 cm.

A thermal treatment boat of this invention comprises a plurality of thermal treatment sections positioned in a coaxial parallel orientation, the support projections for each treatment section each having a wafer support surface, and the wafer support surfaces for each treatment section being substantially coplanar. The distance between the planes of wafer support surfaces in adjacent wafer support sections is preferably from 0.50 to 2.5 cm and the treatment sections are held in said coaxial position by common support elements to which they are supportingly connected. In one embodiment, the wafer transport slot shield element is integral with said first end and extends therefrom to a position overlapping said second end.

The thermal treatment apparatus of this invention comprises a combination of heating chamber surrounded by a heater and a thermal treatment boat as described above.

BRIEF DESCRIPTION OF THE DRAWINGS

FIG. 7 is a schematic view of a wafer transport tongue supporting a wafer as it approaches a circular heat shield in which it is to be positioned.

FIG. 8 is a schematic view of wafer transport tongue supporting a wafer as it approaches a circular heat shield of FIG. 7, elevated above the heat shield.

FIG. 9 is a schematic view of wafer transport tongue of FIG. 8 below the wafer, after it has deposited the wafer in the circular heat shield.

FIG. 10 is a schematic view of the wafer transport tongue of FIG. 9 as it withdraws from the heat shield, after depositing the wafer therein.

DETAILED DESCRIPTION OF THE INVENTION

The apparatus of this invention is used for thermal treatment of thin wafers or glass substrates, primarily in the preparation of semiconductor devices for the electronics industry. This apparatus processes the substrates, supported in a parallel, spaced-apart orientation and positioned in a wafer boat or similar rack with a greatly reduced cycle time without inflicting thermal stress damage to the wafers.

Figure 1:
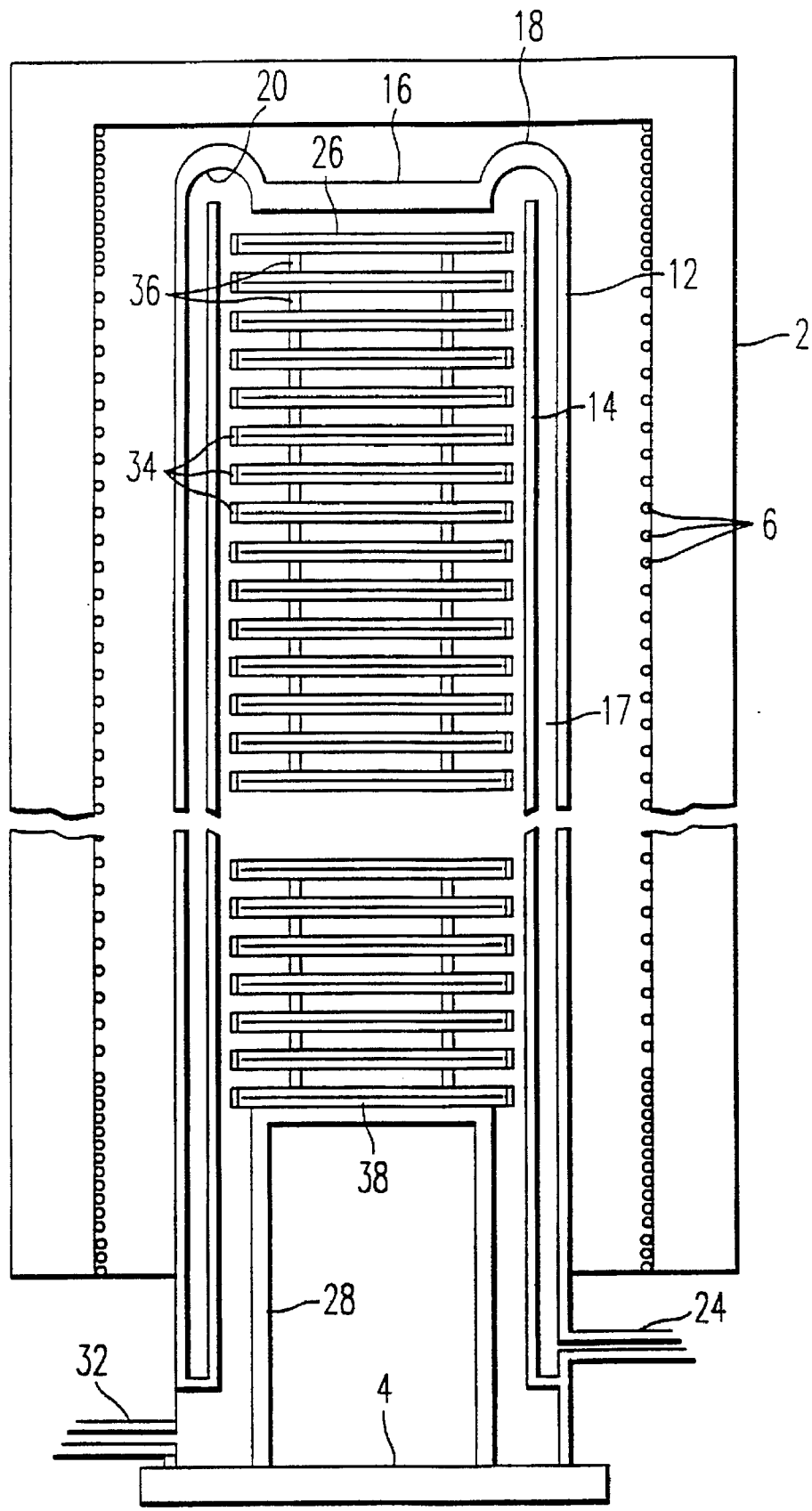
FIG. 1 is a cross-sectional schematic view of a representative thermal treatment apparatus of this invention with a wafer stack placed in the heating zone.
Figure 2:
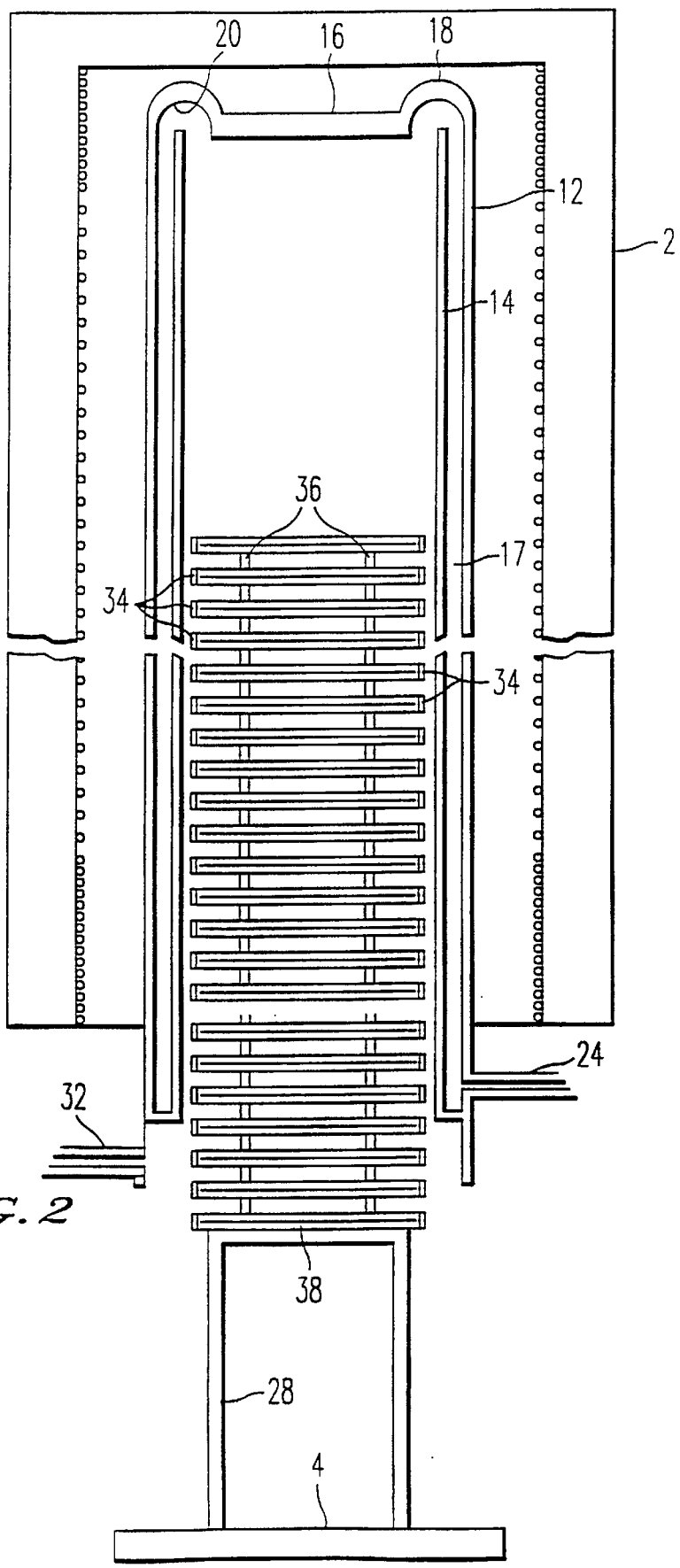
FIG. 2 is a cross-sectional schematic view of the thermal treatment apparatus shown in FIG. 1 with the wafer stack support in a partially lowered position.

FIG. 1 is a cross-sectional schematic view of a representative thermal treatment apparatus of this invention with a wafer stack placed in the heating zone, and FIG. 2 is a cross-sectional schematic view of the thermal treatment apparatus with the wafer stack support in a partially lowered position. This apparatus is a reactor or furnace having an outer insulated housing or casing 2 with an axially moveable base support platform 4. The inner surface of the reactor casing is lined with resistance heating elements 6 or equivalent heat sources distributed to provide a uniform isothermal temperature within the chamber.

The support platform 4 is raised and lowered by a conventional system such as shown in U.S. Pat. No. 5,320, 680, to load the wafer boat in the furnace before heat treatment and to remove it therefrom after the treatment cycle is completed.

The gas flow through the reactor is controlled by the quartz cylinders or tubes 12 and 14. The space 17 between the outer cylinder 12 and the inner cylinder 14 is a preheat zone through which rising gases are passed to raise their temperature to the desired treatment temperature or higher. The upper end of the treatment chamber includes a central disk 16. The curved tube flange 18 extends from the periphery of the disk 16 to the upper end of the outer tube 12. The inner surface 20 of the tube flange 18 is preferably curved, for example in the shape of a section of a torus, to maintain laminar flow patterns of gases being directed thereby and to strengthen the support of the head disk 16 under a vacuum load.

The lower end of the assembly has a gas inlet conduit 24. The reaction heating chamber is defined by the inner cylinder 14. A wafer boat 26 supported on a pedestal 28 is positioned in the heating chamber during the treatment cycle, the inner cylinder 14 defining the gas flow passageway past the wafer boat. The lower portion of the tube assembly has a gas outlet conduit 32. The pedestal 28 can include heating elements (not shown) to reduce heat loss through the lower portion of the chamber.

The wafer boat consists of a plurality of wafer support sections 34 attached to support rods 36, positioned around the outer perimeter in a spacing permitting insertion of wafers into the sections, the rods 36 being attached to the boat base portion 38.

Figure 3:
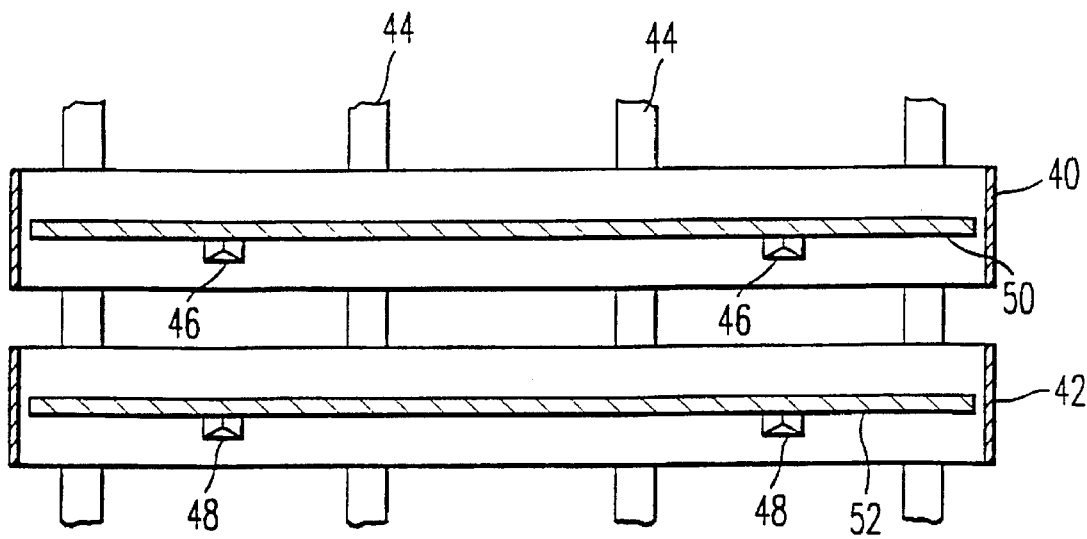
FIG. 3 is cross-sectional view of a portion of a wafer stack, showing the position of the wafers within a circular heat shield.
Figure 4:
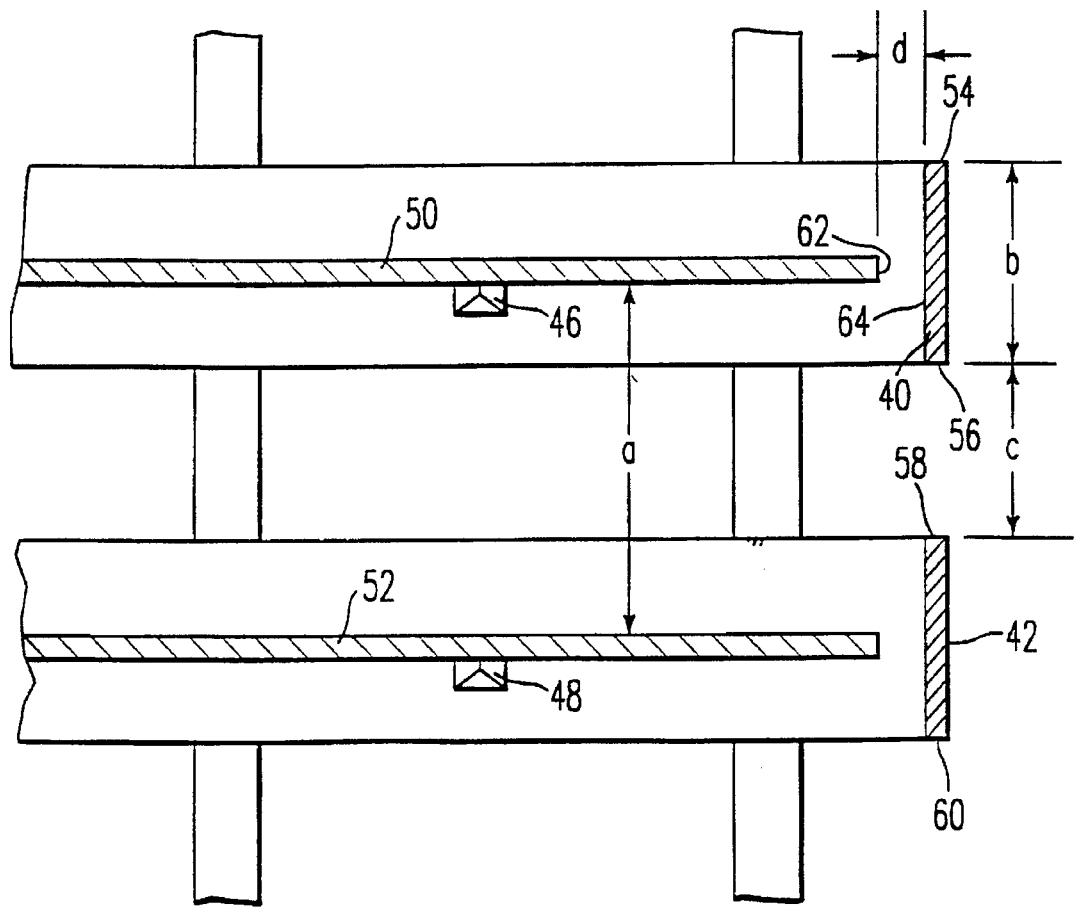
FIG. 4 is a fragmentary, enlarged cross-sectional view of a portion of a wafer stack showing the positional relationship between adjacent wafers and between the wafers and the circular heat shield.

FIG. 3 is cross-sectional view of a portion of a wafer stack, showing the position of the wafers within a circular heat shield, and FIG. 4 is a fragmentary, enlarged cross-sectional view of a portion of a wafer stack showing the positional relationship between adjacent wafers and between the wafers and the circular heat shield. The wafer stack consists of coaxial circular heat shields 40 and 42, each of which is a section of a cylinder secured to vertical support rods 44. Wafer support projections 46 and 48 extend from the inner wall of the respective shields 40 and 42, the upper surfaces thereof being in a plane corresponding to the bottom surface of a wafer 50 and 52 supported thereon. The distance "a" between adjacent wafer support planes is preferably from 0.5 to 2.5 cm.

The heat shields are selected from material such as quartz, silicon carbide, polysilicon and the like which have dimensional and structural stability at the maximum heat treatment temperatures, the purity to prevent contamination of the materials being processed, and the opacity to shield the wafer surface from a portion of the infrared radiant heat emitted by the heat sources surrounding the wafer boat.

The upper heat shields 40 has upper and lower edges 54 and 56, and the lower heat shield 42 has upper and lower edges 58 and 60. The height of each heat shield, that is the distance "b" between its upper and lower edges, is preferably from 0.35 cm to 0.95 cm. For treatment of wafers which are approximately 20 cm in diameter, the preferred shield height "b" is from 0.35 to 0.95 cm.

The distance "c" between the opposing lower edge 56 of an upper heat shield 40 and the upper edge 58 of lower heat shield 42 is from 0.12 to 1.59 cm. For treatment of wafers which are approximately 20 cm in diameter, the preferred distance "c" is from 0.12 to 1.59 cm. The outer edge 62 of each wafer 50 is spaced from the opposed inner surface 64 of the corresponding heat shield by distance "d" which can be from 1.5 to 5.0 mm and is preferably from 1.5 to 5.0 mm.

The height of the heat shields and the distance between the edges of adjacent shields are critically important aspects of this invention since they establish the size and positions of the wafer surfaces which are shielded from direct exposure to the heat sources and those further areas which are shielded from the heat sources which are nearest the wafer, thus establishing a heat conduction pattern in the wafers which are from the inner wafer areas to the outer edges and center. We have discovered that with this heating pattern, temperature differences between the center and outer edges of the wafer are greatly reduced even during rapid heating, greatly reducing the cycle time required to eliminate destructive thermal damage to the wafers.

Figure 5:
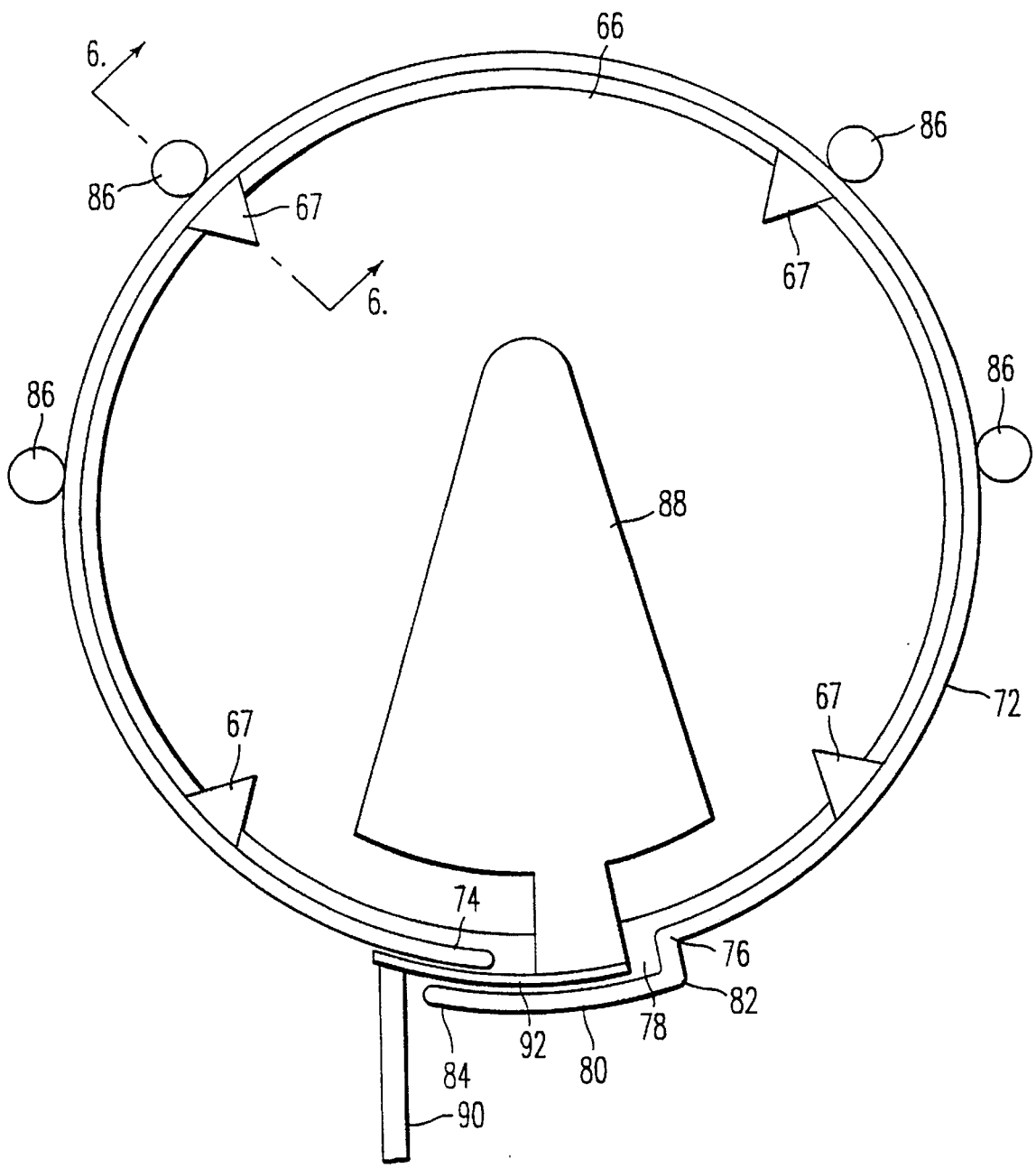
FIG. 5 is a bottom view of a wafer as it is being positioned in the wafer stack by a wafer transport tongue.
Figure 6:
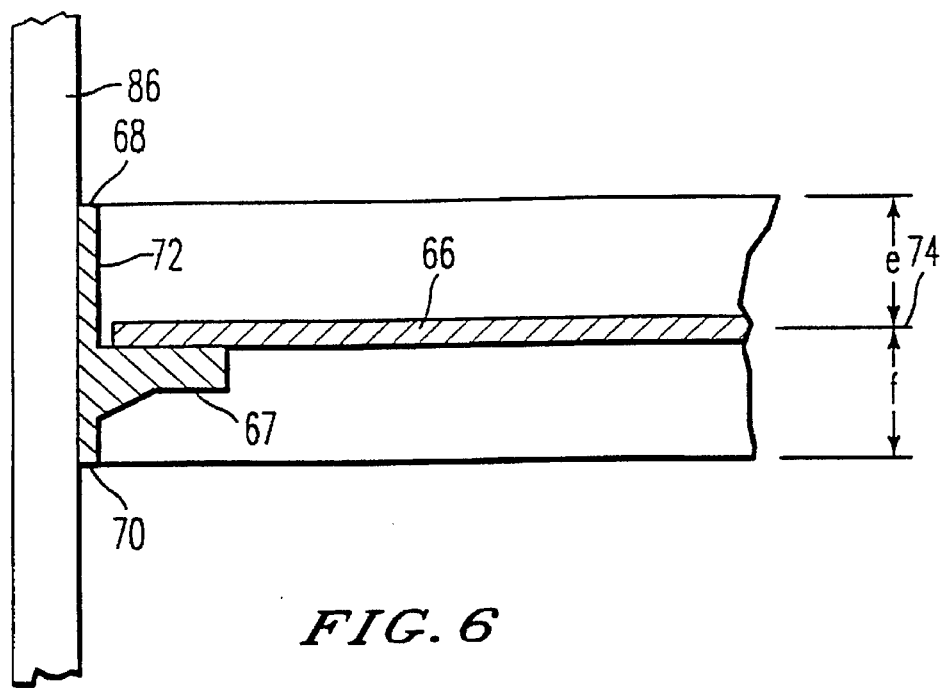
FIG. 6 a fragmentary, enlarged cross-sectional view of a portion of a wafer stack taken along the line 6—6 in FIG. 5, showing the positional relationship between the wafers supported in the circular heat shield and the heat shield.

FIG. 5 is a bottom view of a wafer as it is being positioned in the wafer stack by a wafer transport tongue, and FIG. 6 is a fragmentary, enlarged cross-sectional view, taken along the line 6—6 in FIG. 5 of a portion of a wafer stack showing the positional relationship between the wafers supported in the circular heat shield and the heat shield.

Referring to FIG. 6, the wafer 66 is optimally centered in a position on support 67 which is approximately equidistant from the upper edge 68 and lower edge 70 of the heat shield 72, that is, the distance "e" and "f" from a plane 74 positioned in the center of the wafer, perpendicular to the wafer axis, and planes parallel thereto in which the upper edge 68 and lower edge 72 are preferably substantially the same and are preferably from 0.19 to 0.475 cm. This will provide even heat exposure to the top and bottom surfaces of the wafer.

Referring to FIG. 5, each circular heat shield 72 is a partial circle with opposed ends 74 and 76 defining a gap 78 or wafer transfer slot through which a wafer transfer device is passed in lowering a wafer into position on support projections 67. A wafer transfer slot shield segment 80 is positioned laterally offset from the heat shield 72. Preferably, one end 82 of the shield segment 80 is attached to an end 76 of the heat shield, and the other end 84 of the shield segment 80 extends beyond the other end 74, overlapping the end 74. The heat shields 72 is attached to support rods 86.

When wafers are loaded or unloaded from the wafer boat, each wafer is positioned in a respective heat shield section or removed therefrom. Wafers are loaded into the heat shield section before processing by lowering a wafer transfer support or tongue 88 with a wafer 66 supported thereon downward through the respective shield 72, depositing the wafer on the upper surface of the respective projections 67. The tongue 88 then continues to move downward to below the heat shield, from which position it is withdrawn. Conversely, to remove a wafer from its position in a heat shield, the wafer support tongue 88 is introduced below the heat shield and raised to elevate the wafer from its position to a position above the heat shield. The wafer support, bearing the wafer, is then withdrawn from the boat.

The wafer support 88 is connected to an actuator 90 by means of a connector arm 92 shaped and sized to pass downward through the gap spacing 78 and the offset space between the shield segment 80 and the heat shield 72. In this movement through the heat shield, the connector 92 passes between the surfaces of the heat shield ends and offset shield segment to deposit or remove the wafer from the supports 67. The dimensions of the gap 78 and connector 92 are not critical so long as they are mutually sized to permit free upward and downward passage of the connector 92 through the gap spacing.

FIGS. 7–10 are consecutive schematic views of the movements of the wafer transport components with respect to the heat shield 72 during the deposit of a wafer 66 therein.

In FIG. 7 wafer transport tongue 88 supporting a wafer 66 approaches a circular heat shield 72 in which the wafer 66 is to be positioned. FIG. 8 shows the position with the wafer 66 elevated directly above the heat shield 72. FIG. 9 shows the wafer transport tongue 88 below the wafer 66, after it has deposited the wafer in the circular heat shield 72. FIG. 10 shows the wafer transport tongue 88 as it withdraws from the heat shield 72, after depositing the wafer 66 therein. For removal of a wafer from the heat shield segment, the sequence shown by these schematic views are reversed.

Figure 11:
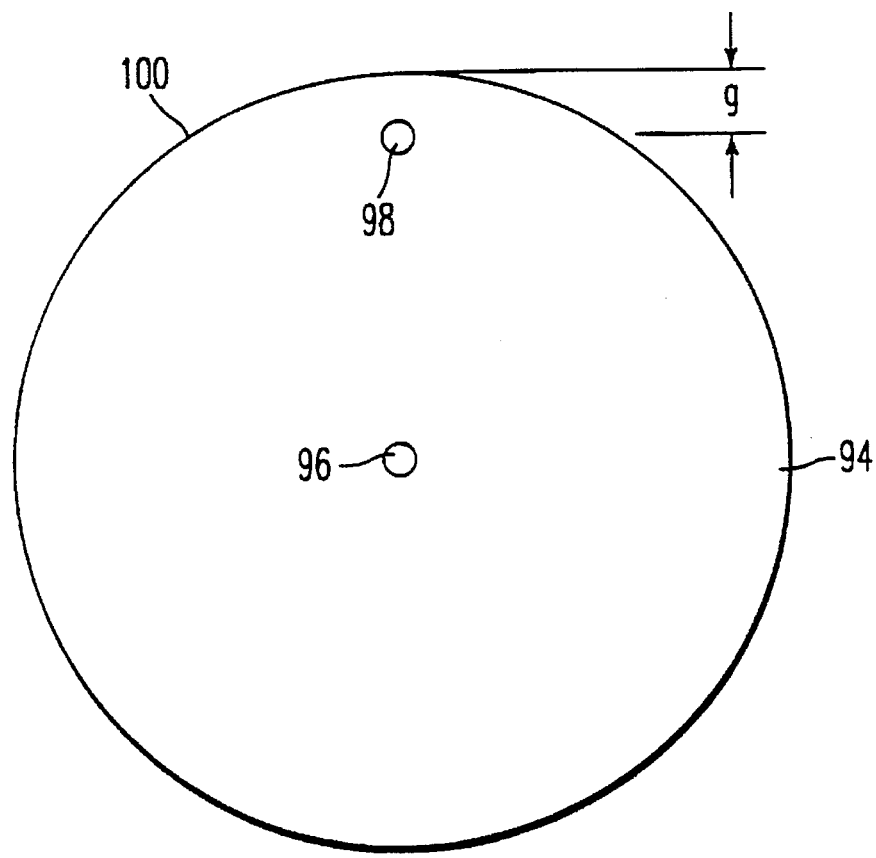
FIG. 11 is a schematic view of a test wafer showing the position of thermocouples on the center and outer periphery of a wafer surface.

FIG. 11 is a schematic view of a test wafer 94 showing the position of thermocouples 96 and 98 on the respective center and outer periphery of a wafer surface. The thermocouples 96, 98 are embedded into the wafer surface. Thermocouple 96 is attached to a test wafer 94 at the axial center of the wafer, and a second thermocouple 98 is attached at a distance "g" of 0.6 cm from the outer edge 100 of the test wafer 94.

Figure 12:
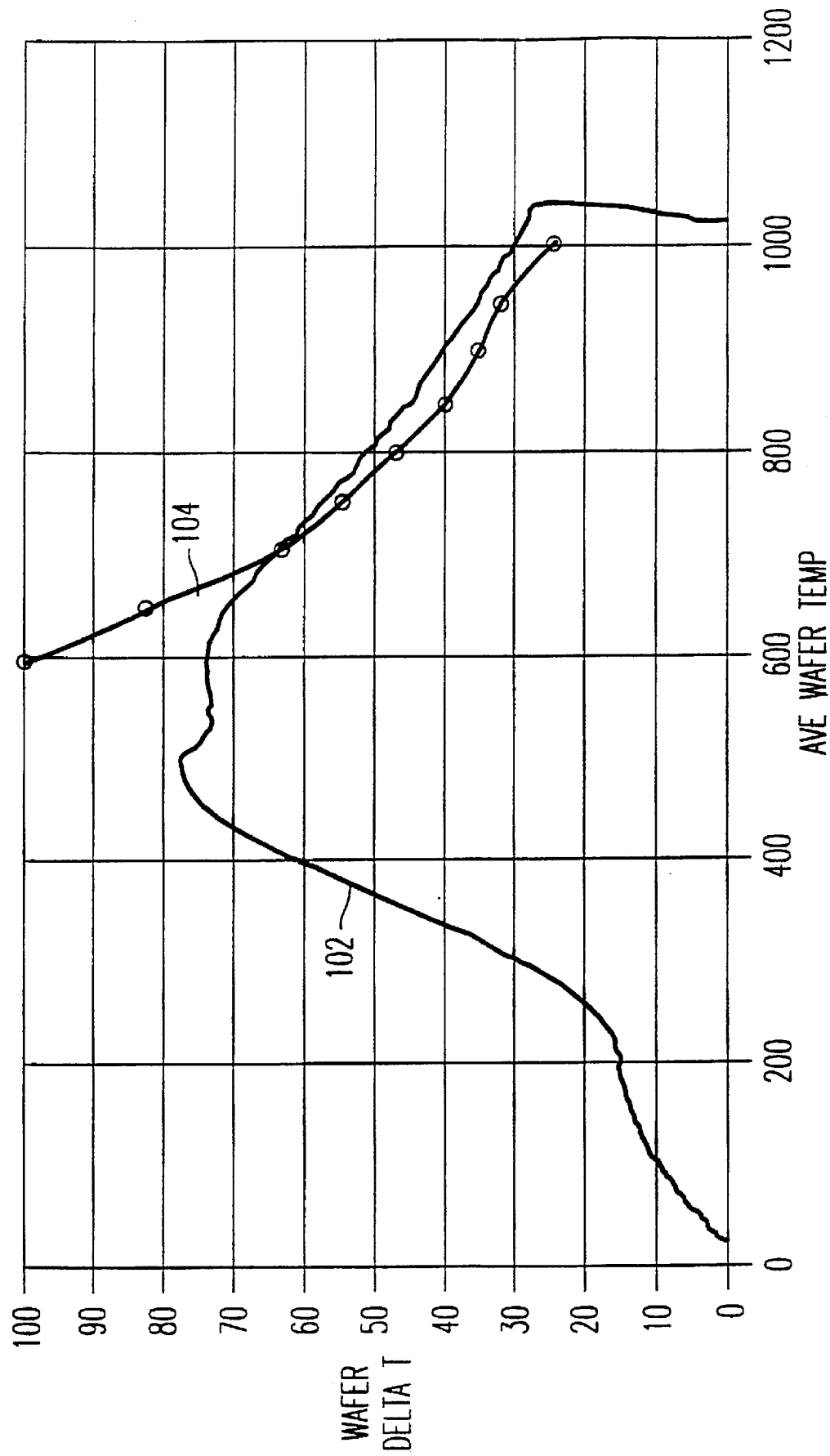
FIG. 12 is a graph view of the temperature differences detected by the thermocouples position as shown in FIG. 11 during rapid heating in a conventional wafer stack.

FIG. 12 is a graph view of the temperature differences detected by thermocouples positioned as shown in FIG. 11 during rapid heating in a conventional wafer stack. The wafer stack was exposed to a fast ramp element at 75° C./min from 25° C. to 1000° C. FIG. 12 shows a plot 102 of the temperature differences between the measurements by the thermocouples 96 and 98 is shown as a Delta T versus the average wafer temperature over the full thermal cycle. This data was taken with 25 wafers spaced above and 25 wafers spaced below the test wafer in a standard wafer boat, with a distance of 2.54 cm between the wafer immediately above and immediately below the test wafer. The temperature difference plot 104 represents the maximum acceptable stress limit to which a wafer can be exposed without significant structural damage. As can be seen, the temperature profile 102 experienced with the conventional wafer boat construction exceeded the stress limits above about 700° C.

Figure 13:
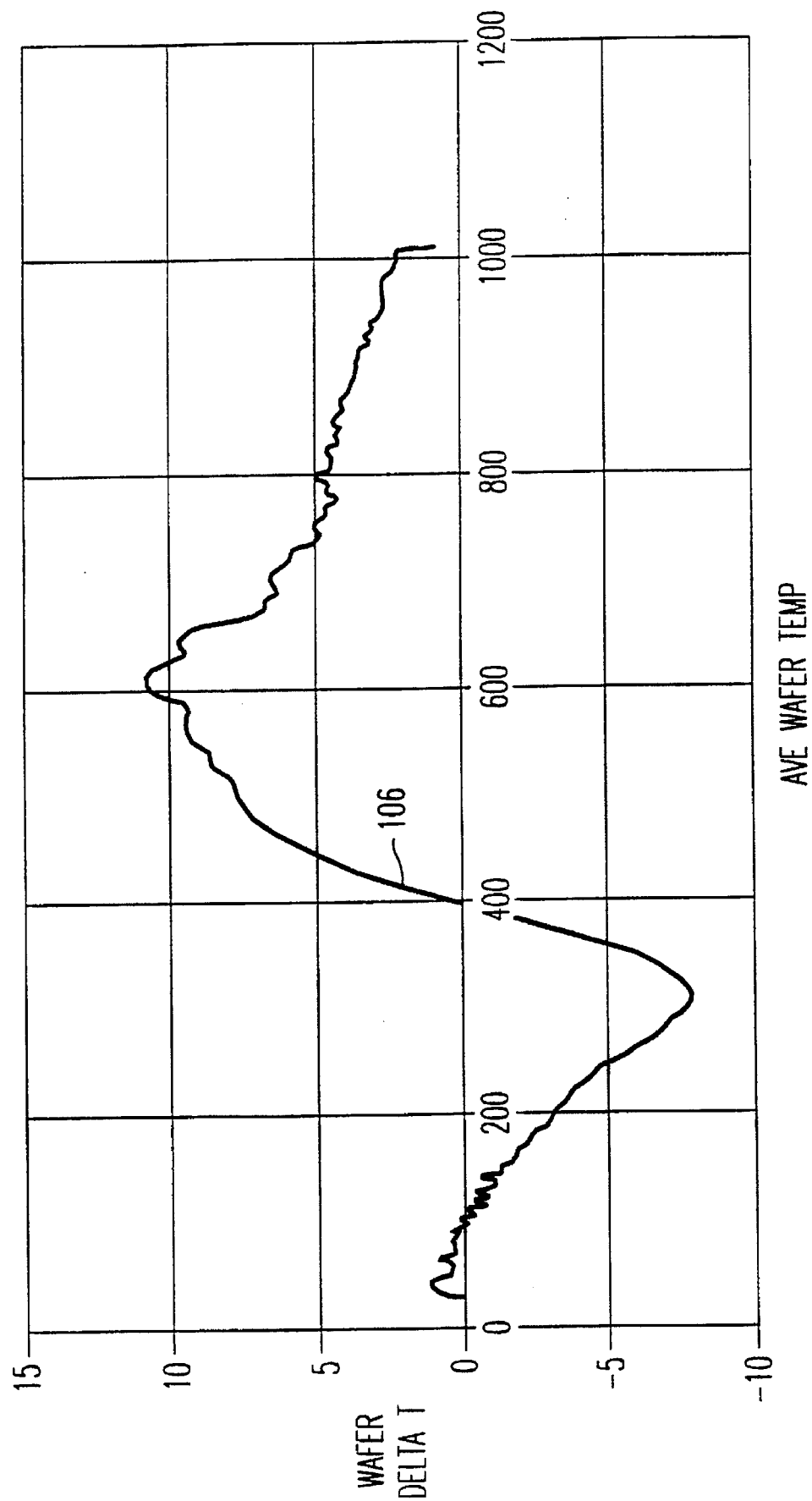
FIG. 13 is a graph view of the temperature differences detected by the thermocouples position as shown in FIG. 11 during rapid heating in a wafer stack according to this invention.

FIG. 13 is a graph view of the temperature differences detected by the thermocouples position as shown in FIG. 11 during rapid heating in a wafer stack with heat shields according to this invention. The wafer stack was exposed to a fast ramp element at 75° C./min from 25° C. to 1000° C. The test wafer 94 was positioned with 25 wafers above and 25 wafers below, the test wafer being positioned in a circular shield according to this invention with a height of 2.54 cm. The distance between the test wafer and wafers immediately above and below it were 2.54 cm. The temperature differences shown in plot 106 detected by the thermocouples at the center and edge of the test wafer 94 and experienced by the test wafer were far below the maximum acceptable stress limit plot (FIG. 12 values).

Obviously, numerous modifications and variations of the present invention are possible in light of the above teachings. It is therefore to be understood that within the scope of the appended claims, the invention may be practiced otherwise than as specifically described herein.

The invention claimed is:

1. A thermal treatment boat wafer treatment section comprising a circular shield wall having an upper edge, a lower edge, the shield being an incomplete circle with opposed first and second end surfaces defining a wafer transport slot therebetween, the inner shield wall surface thereof having a plurality of wafer support projections extending inwardly therefrom, each wafer support projection having a wafer support surface positioned for supporting a wafer thereon in a position which is substantially centered between said upper edge and said lower edge of the circular shield wall, the treatment section including a wafer transport slot shield element, laterally displaced from said shield wall and positioned to block direct radiant heat passage through the wafer transport slot.

2. A thermal treatment boat wafer treatment section of claim 1 wherein the wafer transport slot shield element is integral with said first end and extends therefrom to a position overlapping said second end surface.

3. A thermal treatment boat wafer treatment section of claim 1 wherein the inner diameter of the circular shield wall is from 20.3 to 21.0 cm and the height thereof is from 0.35 to 0.95 cm.

4. A thermal treatment boat wafer treatment section of claim 3 wherein the inner diameter of the circular shield wall for a wafer of a specific diameter is about 3 mm greater than the outer diameter of said wafer.

5. A thermal treatment boat wafer treatment section of claim 3 for treating wafers having a diameter of approximately 20 cm wherein the inner diameter of the shield wall is about 3 mm greater than the outer diameter of said wafers and the height thereof is from 0.35 to 0.95 cm.

6. A thermal treatment boat comprising a plurality of thermal treatment sections according to claim 1, positioned in a coaxial parallel orientation, the support projections for each treatment section each having a wafer support surface, the wafer support surfaces for each treatment section being substantially coplanar, and the distance between the planes of wafer support surfaces in adjacent wafer support sections being from 0.5 to 2.5 cm.

7. A thermal treatment boat according to claim 6 wherein the treatment sections are held in said coaxial position by common support elements to which they are supportingly connected.

8. A thermal treatment boat according to claim 6 wherein the wafer transport slot shield element is integral with said first end and extends therefrom to a position overlapping said second end.

9. A thermal treatment apparatus comprising a combination of heating chamber surrounded by a heater and a thermal treatment boat comprising a plurality of thermal treatment sections positioned in coaxial parallel orientation, the support projections for each treatment section each having a wafer support surface, the wafer support surfaces for each treatment section being substantially coplanar, and the distance between the planes of wafer support surfaces in adjacent wafer support sections being from 0.5 to 2.5 cm, each thermal treatment section comprising a circular shield wall having an upper edge and a lower edge, the inner shield wall surface thereof having a plurality of wafer support projections extending inwardly therefrom, wherein the inner diameter of the circular shield wall is from 20.3 to 21.0 cm and the height thereof is from 0.35 to 0.95 cm, and wherein each wafer support projection has a wafer support surface positioned for supporting a wafer thereon, the wafer being supported in a position which is substantially centered between said upper edge and said lower edge of the circular shield wall.

10. A thermal treatment apparatus of claim 8 wherein each shield is an incomplete circle with opposed first and second end surfaces defining a wafer transport slot therebetween, and the treatment section includes a wafer transport slot shield element, laterally displaced from said shield wall and positioned to block direct radiant heat passage through the wafer transport slot.

11. A thermal treatment boat wafer treatment section of claim 10 wherein the wafer transport slot shield element is integral with said first end and extends therefrom to a position overlapping said second end surface.

12. A thermal treatment boat wafer treatment section of claim 10 wherein the inner diameter of the circular shield wall for a wafer of a specific diameter is about 3 mm greater than the outer diameter of said wafer.

13. A thermal treatment boat wafer treatment section of claim 10 for treating wafers having a diameter of approximately 20 cm wherein the inner diameter of the shield wall is about 3 mm greater than the outer diameter of said wafers and the height thereof is from 0.35 to 0.95 cm.

14. A process for heat treating multiple wafers positioned in mutually parallel orientation in a heating zone surrounded by a heater emitting radiant heat, the improvement comprising maintaining a space of from 0.5 to 2.5 cm between each wafer and shielding the outer portions of each wafer from radiant heat emitted by the heater with a circular heat shield positioned between the outer edge of the wafer and the heater, wherein the circular heat shield has an upper edge and a bottom edge, and is positioned at a distance of about 3 mm from the outer edge of the wafer, the wafer is positioned to be substantially centered between said upper edge and said bottom edge of its respective heat shield, and the circular heat shield has a height of from 0.35 to 0.95 cm.

15. A process of claim 14 wherein the heat provided by the heater is sufficient to raise the temperature of the wafers from 21° C. up to 1100° C. at a rate of from 50° C./min to 100° C./min without causing thermal stress damage to the wafers.

* * * * *